(12) United States Patent
Engelhardt et al.

(10) Patent No.: US 6,754,000 B2
(45) Date of Patent: Jun. 22, 2004

(54) OPTICAL ARRANGEMENT, AND METHOD FOR THE DEFLECTION OF LIGHT BEAMS

(75) Inventors: Johann Engelhardt, Bad Schoenborn (DE); Juergen Hoffmann, Wiesbaden (DE)

(73) Assignee: Leica Microsystems Heidelberg GmbH, Mannheim (DE)

( * ) Notice: Subject to any disclaimer, the term of this patent is extended or adjusted under 35 U.S.C. 154(b) by 430 days.

(21) Appl. No.: 09/969,816

(22) Filed: Oct. 3, 2001

(65) Prior Publication Data

US 2002/0044332 A1 Apr. 18, 2002

(30) Foreign Application Priority Data

Oct. 4, 2000 (DE) .......................... 100 49 296

(51) Int. Cl.[7] .............................. G02F 1/33; G02F 1/11; G02B 26/00; H01J 5/16; B41J 2/47
(52) U.S. Cl. ...................... 359/305; 359/291; 359/298; 359/285; 250/234; 250/235; 347/239; 347/255; 355/71
(58) Field of Search ................................ 359/305, 290, 359/291, 298, 292, 293, 279, 306, 308, 312, 285, 559, 204, 212; 250/234, 235; 347/239, 255; 355/53, 71

(56) References Cited

U.S. PATENT DOCUMENTS

| 4,893,008 | A |  | 1/1990 | Horikawa ................... 250/234 |
|---|---|---|---|---|
| 5,485,301 | A | * | 1/1996 | Miller ......................... 398/129 |
| 5,574,537 | A | * | 11/1996 | Ozawa ......................... 355/71 |
| 5,981,903 | A | * | 11/1999 | Baumgart et al. ..... 219/121.77 |
| 6,008,930 | A | * | 12/1999 | Nishikawa et al. .......... 359/285 |
| 6,011,256 | A | * | 1/2000 | Takada ........................ 250/235 |
| 6,144,483 | A | * | 11/2000 | Allen et al. .................. 359/305 |
| 6,295,079 | B1 | * | 9/2001 | Saito ........................... 347/255 |
| 6,307,895 | B1 | * | 10/2001 | Alexander et al. .......... 375/316 |
| 6,341,029 | B1 | * | 1/2002 | Fillion et al. ................ 359/212 |
| 6,424,451 | B1 | * | 7/2002 | Chang ......................... 359/308 |

FOREIGN PATENT DOCUMENTS

DE 4200374 5/1996

* cited by examiner

*Primary Examiner*—Loha Ben
(74) *Attorney, Agent, or Firm*—Davidson, Davidson & Kappel, LLC

(57) ABSTRACT

An optical arrangement having a light source, preferably a laser, for generating a light beam (1); at least one acoustooptical deflection device (3) for the light beam (1); and a correction device for correcting beam aberrations produced by the deflection device (3) is configured, in the interest of flexible and reliable correction of aberrations occurring because of the deflection, in such a way that the correction device comprises an adaptive optical system (2). Also described is a method for the deflection of light beams (1) with a light source, preferably a laser, for generating a light beam (1); at least one acoustooptical deflection device (3) for the light beam (1); and a correction device for correcting beam aberrations produced by the deflection device (3), in which an adaptive optical system (2) is used as the correction device.

11 Claims, 1 Drawing Sheet

Fig.
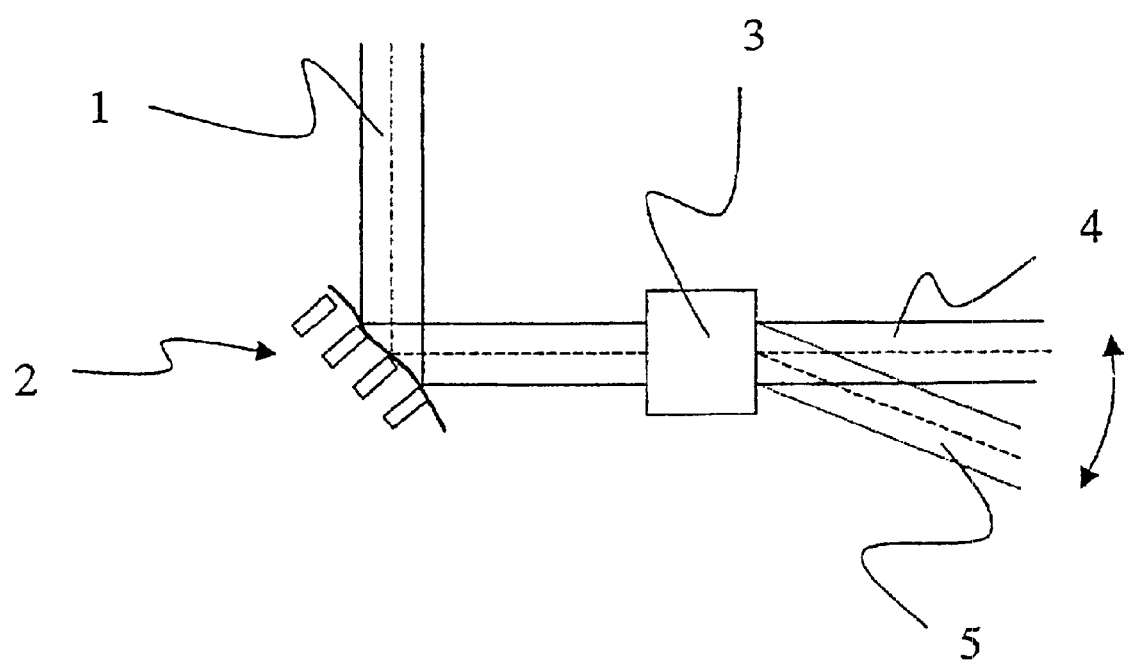

OPTICAL ARRANGEMENT, AND METHOD FOR THE DEFLECTION OF LIGHT BEAMS

CROSS REFERENCE TO RELATED APPLICATIONS

This invention claims priority of the German patent application 100 49 296.7 which is incorporated by reference herein.

FIELD OF THE INVENTION

The invention concerns an optical arrangement having a light source, preferably a laser, for generating a light beam; at least one acoustooptical deflection device for the light beam; and a correction device for correcting beam aberrations produced by the deflection device.

The invention furthermore concerns a method for the deflection of light beams with a light source, preferably a laser, for generating a light beam; at least one acoustooptical deflection device for the light beam; and a correction device for correcting beam aberrations produced by the deflection device.

BACKGROUND OF THE INVENTION

Optical arrangements and methods for the deflection of light beams of the kind cited above are known from practical use, and exist in a wide variety of embodiments. Controllable deflection devices are used in many fields, from copiers to scanning microscopes. Beam deflection is often effected with mirrors that are tilted with the aid of galvanometers. The known correction devices function simultaneously with operation of the optical arrangement.

In scanning microscopy, for example, a specimen is illuminated with a light beam in order to observe the reflected and/or fluorescent light emitted by the specimen. The focus of the light beam is generally moved in one specimen plane by tilting two mirrors, the deflection axes usually being perpendicular to one another so that one mirror deflects in the X direction and the other in the Y direction. Tilting of the mirror is effected with the aid of both resonant and non-resonant galvanometer positioning elements. The power level of the light coming from the specimen is measured as a function of the position of the scanning beam or light beam.

As disclosed, for example in U.S. Pat. No. 4,893,008, "Scanning optical microscope," acoustooptical deflectors are also used instead of galvanometers in scanning microscopy. The deflection is based on interaction of the light with a mechanical standing or moving wave that usually is produced in a transparent crystal using ultrasonic transmitters.

In confocal scanning microscopy in particular, a specimen is scanned in three dimensions with the focus of a light beam. A confocal scanning microscope generally comprises a light source, a focusing optical system with which the light of the light source is focused onto a pinhole (called the excitation stop), a beam splitter, a deflection apparatus for beam control, a microscope optical system, a detection stop, and the detectors for detecting the detected or fluorescent light. The illuminating light, or the light beam generated by the light source, is usually coupled into the beam path via a main beam splitter. The fluorescent or reflected light coming from the specimen arrives via the same deflection device or the same scanning mirror back at the main beam splitter and passes through it; it is then focused onto the detection stop, behind which the detectors (usually photomultipliers) are located. Detected light that does not derive directly from the focus region takes a different light path and does not pass through the detection stop; what is therefore obtained is a point datum that results, by sequential scanning of the specimen, in a three-dimensional image. A three-dimensional image is usually achieved by acquiring images in layers.

Very particularly in confocal scanning microscopy, in order to achieve optimum results in terms of resolution, the shape and intensity distribution—the point-spread function or PSF—of the scanning light beam focus must closely correspond to the theoretically achievable optimum shape or PSF.

Confocal scanning microscopes having acoustooptical deflectors are known, for example, from U.S. Pat. No. 4,893,008 of the Olympus Company (inventor: Horikawa), and are sold by NORAN Instruments.

With the galvanometer technology that is usually used at present for deflection of the light beam, maximum achievable scan rates are limited by the inertia of the moving mechanical components to several hundred Hz for non-resonant galvanometers and several kHz for resonant galvanometers.

Acoustooptical deflectors and deflection devices are very much faster than, for example, scanners based on galvanometer deflection. They have the disadvantage, however, that beam quality is degraded upon passage through these elements. The correlations are described, for example, in Huang et al., "Laser beam profile deformation effect during Bragg acousto-optic interaction: a non-paraxial approximation," Optical Engineering, July 1999, Vol. 38, No. 7, ISSN 0091-3286.

DE 42 00 374 A1, Sandström, also deals with the correction of aberrations that are brought about during the deflection of light beams with acoustooptical elements. In this, a passive element that is not flexible is used for aberration correction.

One principal source of aberrations is the finite beam diameter. To achieve continuous deflection, the ultrasonic frequency must be continuously increased and decreased. In the case of an acoustic wave with a continuously changing wavelength traveling through the crystal, at a given point in time the wavelengths acting on the transverse light beam edges are different from those acting on the portions of light beam close to the optical axis.

With the known optical arrangements and methods for the deflection of light beams, aberration correction is not flexible and in many cases is unsatisfactory in terms of quality.

SUMMARY OF THE INVENTION

It is therefore the object of the present invention to describe an optical arrangement with which a flexible and reliable correction of aberrations occurring because of the deflection of the light beam is attained.

According to the present invention, the aforesaid object is achieved by an optical arrangement comprising:
  a light source, for generating a light beam;
  at least one acoustooptical deflection device for the light beam; and
  a correction device for correcting beam aberrations produced by the deflection device, wherein the correction device is an adaptive optical system which is an active optical element for the correction of phase front aberrations.

It is a further object of the present invention to describe a method for the deflection of light beams, with which a flexible and reliable correction of aberrations occurring because of the deflection is attained.

The above object is achieved by a method comprising the steps of:

generating a light beam with a light source, deflecting the light beam with at least one acoustooptical deflection device; and correcting beam aberrations produced by the deflection device with a correction device which is an active adaptive optical system.

What has been recognized according to the present invention is that the aforesaid object is achieved in surprisingly simple fashion by the provision of an adaptive optical system in the context of the correction device. An adaptive optical system results in flexible and reliable correction of aberrations occurring because of the deflection.

In the interest of reliable correction of beam aberrations, the adaptive optical system could be arranged in the beam path of the light beam. The adaptive optical system could in fact be arranged in the beam path of the light beam to be deflected, the adaptive optical system acting in corrective fashion on the light beam even before deflection of the light beam.

Concretely, the adaptive optical system could comprise an active optical element, in particular for the correction of phase front aberrations. An active optical element having a mirror that is deformable with preferably electrostatic actuators has proven to be particularly effective and flexible. Mirrors of this kind are known and commercially available.

Alternatively or in addition thereto, the adaptive optical system could comprise an element with which phase retardations can be impressed in controlled fashion onto individual parts of the illuminating and/or detected light beam. Concretely, an element of this kind could be an LCD matrix element.

An element as described above could, in particularly effective fashion, be arranged in the beam path in a Fourier plane conjugated with the deflection plane.

In the interest of uniform and optimum transverse field distribution of the light beams, the element could be actively controllable in open- and/or closed-loop fashion. A device for sensing the instantaneous transverse field distribution could be provided for the purpose. The device could coact with a processing logic system for signals of the device, with which a suitable control signal can be generated. The control signal serves to control the adaptive optical system.

A Hartmann-Shack sensor could serve to measure the phase front. This sensor usually comprises a micro-lens array that focuses the spread-out and collimated light bundle being examined onto a CCD array or a photodiode field. When the phase front of the incident light beam is free of aberrations, all the foci generated by the micro-lens array are located equidistantly on the detector surface. This is not the case if the phase front of the incident light is deformed. The lateral displacement of the foci provides information as to the aberrations. Zernike polynomials calculated from the detector signals are usually used for descriptive purposes. According to the invention, provision is made for the detector signals to be evaluated in a computer that controls the active optical elements for correction. Alternatively, a Twyman-Green interferometer could also be used to measure the phase front.

In the interest of a simpler configuration of the optical arrangement in which simultaneous aberration correction is not performed, the aberrations occurring in the context of deflection, for example as a function of the deflection angle, could be measured on a one-time basis for calibration of the control system of the adaptive optical system. The necessary correction signals could then be calculated and stored in a memory. During the actual scanning operation, the correction data could be read out and used to control the adaptive optical system. For that purpose, the optical arrangement could comprise a measuring instrument for at least one-time measurement of the aberrations occurring in the context of deflection, preferably as a function of the deflection angle. Concretely, the measuring instrument could calculate the control signals suitable for correction. A memory could be associated with the measuring instrument for storage of the data.

Concretely, the adaptive optical system could be arranged in the beam path of the light beam to be deflected. An active optical element, in particular for the correction of phase front aberrations, could be used in the context of the adaptive optical system.

A mirror that is deformable with preferably electrostatic actuators could be used in the context of the active optical element.

In particularly effective fashion, an element with which phase retardations can be impressed in controlled fashion onto individual parts of the illuminating and/or detected light beam could be used in the context of the adaptive optical system. An LCD matrix element could be used as the element. In principle, the element could be arranged in the beam path in a Fourier plane conjugated with the deflection plane.

In the interest of an optimum and uniform transverse field distribution of the light beams, the element could be actively controlled in open- and/or closed-loop fashion.

For aberration detection, a device for sensing the instantaneous transverse field distribution could be used. A processing logic system for signals of the device, which coacts with the device and with which a suitable closed- or open-loop control signal for controlling the adaptive optical system can be generated, could be used in this context.

A Hartmann-Shack sensor or a Twyman-Green interferometer could be used in the context of the device.

In a simplified method, a measuring instrument could be used for at least one-time measurement of the aberrations occurring in the context of deflection, preferably as a function of the deflection angle. For example, the control signals suitable for correction could be calculated with the measurement device and stored, preferably in a memory. During the deflection operation, the control signals could be read out of the memory and used to control the adaptive optical system.

BRIEF DESCRIPTION OF THE DRAWINGS

There are various ways of advantageously embodying and developing the teaching of the present invention. In conjunction with the explanation of the preferred exemplary embodiment of the invention with reference to the drawings, an explanation is also given of generally preferred embodiments and developments of the teaching. In the drawings, the single FIGURE schematically and partially depicts the exemplary embodiment of an optical arrangement according to the present invention.

DETAILED DESCRIPTION OF THE INVENTION

The single FIGURE partially and schematically depicts the exemplary embodiment of an optical arrangement according to the present invention. The optical arrangement comprises a light source (not shown), preferably a laser, for generating an incident light beam 1. The optical arrangement furthermore comprises an acoustooptical deflection device 3 for light beam 1, and a correction device for correcting beam aberrations produced by deflection device 3. In the interest of flexible and reliable correction of aberrations occurring because of the deflection, the correction device comprises an adaptive optical system 2.

Adaptive optical system 2 is arranged, even before deflection device 3, in the beam path of light beam 1 to be deflected. Adaptive optical system 2 is constituted by a so-called piezo-mirror. Elements other than the deformable piezo-mirror shown in the FIGURE could, however, also be used as adaptive optical system 2.

The single FIGURE furthermore depicts an undeflected light beam path 4 and a deflected light beam path 5.

Regarding further advantageous embodiments and developments of the teaching according to the present invention, the reader is referred on the one hand to the general portion of the specification and on the other hand to the appended Claims.

In conclusion, let be it emphasized very particularly that the exemplary embodiment selected in purely arbitrary fashion above serves merely for discussion of the teaching claimed, but does not limit it to this exemplary embodiment.

What is claimed is:

1. An optical arrangement comprising:
   a light source, for generating a light beam;
   at least one acoustooptical deflection device for the light beam; and
   a correction device for correcting beam aberrations produced by the deflection device, wherein the correction device is an adaptive optical system which is an active optical element for the correction of phase front aberrations.

2. The optical arrangement as defined in claim 1, wherein the active optical element comprises a mirror that is deformable with preferably electrostatic actuators.

3. The optical arrangement as defined in claim 1, wherein the adaptive optical system comprises an element with which phase retardations can be impressed in controlled fashion onto individual parts of the illuminating and/or detected light beam.

4. The optical arrangement as defined in claim 1, wherein the active optical element is an LCD matrix element.

5. The optical arrangement as defined in claim 1, wherein the active optical element is arranged in the beam path in a Fourier plane conjugated with the deflection plane.

6. The optical arrangement as defined in claim 1, wherein the light source is a laser.

7. A method for the deflection of light beams comprises the steps of:
   generating a light beam with a light source,
   deflecting the light beam with at least one acoustooptical deflection device; and
   correcting beam aberrations produced by the deflection device with a correction device which is an active adaptive optical system.

8. The method as defined in claim 7, wherein a mirror that is deformable with preferably electrostatic actuators is used as the active optical system.

9. The method as defined in claim 7, wherein an element with which phase retardations can be impressed in controlled fashion onto individual parts of the light beam is used in the context of the active optical system.

10. The method as defined in claim 7, wherein the active optical system is arranged in the beam path in a Fourier plane conjugated with the deflection plane.

11. The method as defined in claim 7, wherein the light source is a laser.

\* \* \* \* \*